(12) United States Patent
Bhat et al.

(10) Patent No.: US 11,557,348 B1
(45) Date of Patent: Jan. 17, 2023

(54) ENHANCED WORD LINE STRIPE ERASE ABORT DETECTION

(71) Applicant: Western Digital Technologies, Inc., San Jose, CA (US)

(72) Inventors: Vinayak Bhat, Bangalore (IN); Amiya Banerjee, Bangalore (IN); Shrinidhi Kulkarni, Milpitas, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/357,053

(22) Filed: Jun. 24, 2021

(51) Int. Cl.
| | |
|---|---|
| *G11C 16/16* | (2006.01) |
| *G11C 16/04* | (2006.01) |
| *G11C 16/26* | (2006.01) |
| *G11C 16/08* | (2006.01) |
| *G06F 3/06* | (2006.01) |
| *G06F 11/10* | (2006.01) |

(52) U.S. Cl.
CPC ............. *G11C 16/16* (2013.01); *G06F 3/064* (2013.01); *G06F 3/0619* (2013.01); *G06F 3/0652* (2013.01); *G06F 3/0659* (2013.01); *G06F 3/0673* (2013.01); *G06F 11/1068* (2013.01); *G11C 16/0483* (2013.01); *G11C 16/08* (2013.01); *G11C 16/26* (2013.01)

(58) Field of Classification Search
CPC ..... G11C 16/16; G11C 16/0483; G11C 16/08; G11C 16/26; G06F 3/0619; G06F 3/064; G06F 3/0652; G06F 3/0659; G06F 3/0673; G06F 11/1068
See application file for complete search history.

(56) References Cited

U.S. PATENT DOCUMENTS

| | | | | |
|---|---|---|---|---|
| 7,669,004 | B2 | 2/2010 | Lin et al. | |
| 9,899,077 | B2* | 2/2018 | Hsu | G11C 11/5628 |
| 10,452,471 | B2* | 10/2019 | Shen | G11C 16/10 |
| 2015/0332759 | A1* | 11/2015 | Huang | G11C 11/5642 |
| | | | | 365/185.03 |
| 2019/0259457 | A1 | 8/2019 | Jun | |
| 2020/0286566 | A1 | 9/2020 | Lee | |
| 2020/0350025 | A1 | 11/2020 | Purahmad et al. | |
| 2021/0027845 | A1* | 1/2021 | Lu | G06F 3/0604 |
| 2021/0406107 | A1* | 12/2021 | Banerjee | G06F 11/079 |

* cited by examiner

*Primary Examiner* — Guy J Lamarre
(74) *Attorney, Agent, or Firm* — Ravi Mohan; Rutan & Tucker, LLP

(57) ABSTRACT

Storage devices include a memory array comprised of a plurality of memory devices arranged in word lines. The word lines are further arranged within memory blocks. When erasing memory blocks, various storage devices may utilize a stripe-erase process that alternates the erasure of word lines within the memory blocks. The stripe-erase process is often carried out in multiple steps. However, an ungraceful shutdown can interrupt the erasing processing between one of these stripe-erase steps. The status of each memory device associated with the aborted erasure needs to be known before operations can continue. Methods and systems described herein properly classify and process memory blocks after an aborted erase command by analyzing both even and odd word lines within each of the memory blocks. By properly categorizing each memory block, over-programming and other negative effects can be avoided, increasing the overall lifespan of the storage device that utilizes a stripe-erase process.

20 Claims, 6 Drawing Sheets

ENHANCED WORD LINE STRIPE ERASE ABORT DETECTION

FIELD

The present disclosure relates to storage systems. More particularly, the present disclosure relates to utilizing an enhanced erase abort detection process when evaluating word lines that are erased utilizing a stripe erase method.

BACKGROUND

Storage devices are ubiquitous within computing systems. Recently, solid-state memory devices capable of nonvolatile storage of charge have become the predominant choice within various consumer electronics products. Popular types of solid-state memory devices include flash-type electrically erasable programmable read-only memory ("EEPROM"). These memory devices are typically NAND-based which can be erased and have new data written or "programmed" into the devices or "cells".

These memory devices are often grouped within word lines which are themselves grouped within a page which further grouped within a block of memory. Blocks of memory may further be grouped together within a memory array. While memory devices may be configured for programming at the page level, many storage devices are only able to delete data at the block level. In a growing number of these storage devices, the erasure of data within blocks is performed in a strip-erase process that erases a first group of alternating word lines (even word lines) and a remaining second group of alternating word lines (odd word lines).

However, during normal operations, the storage device may experience an ungraceful shutdown including a sudden loss of power that halts operations within the storage device without properly wrapping up all currently running operations. When a storage device is erasing data within the memory array, an ungraceful shutdown can cause an interruption of the stripe-erase process. This can lead to situations where particular word lines have been erased while others have not.

In many instances, the storage device may not have data indicating which memory cells (or respective pages) were being programmed at the time of the ungraceful shutdown. Additionally, even when the storage device may contain control data indicating the affected memory pages, the exact stage of the stripe-erase process that is completed is often not known.

BRIEF DESCRIPTION OF DRAWINGS

The above, and other, aspects, features, and advantages of several embodiments of the present disclosure will be more apparent from the following description as presented in conjunction with the following several figures of the drawings.

Figure 1:
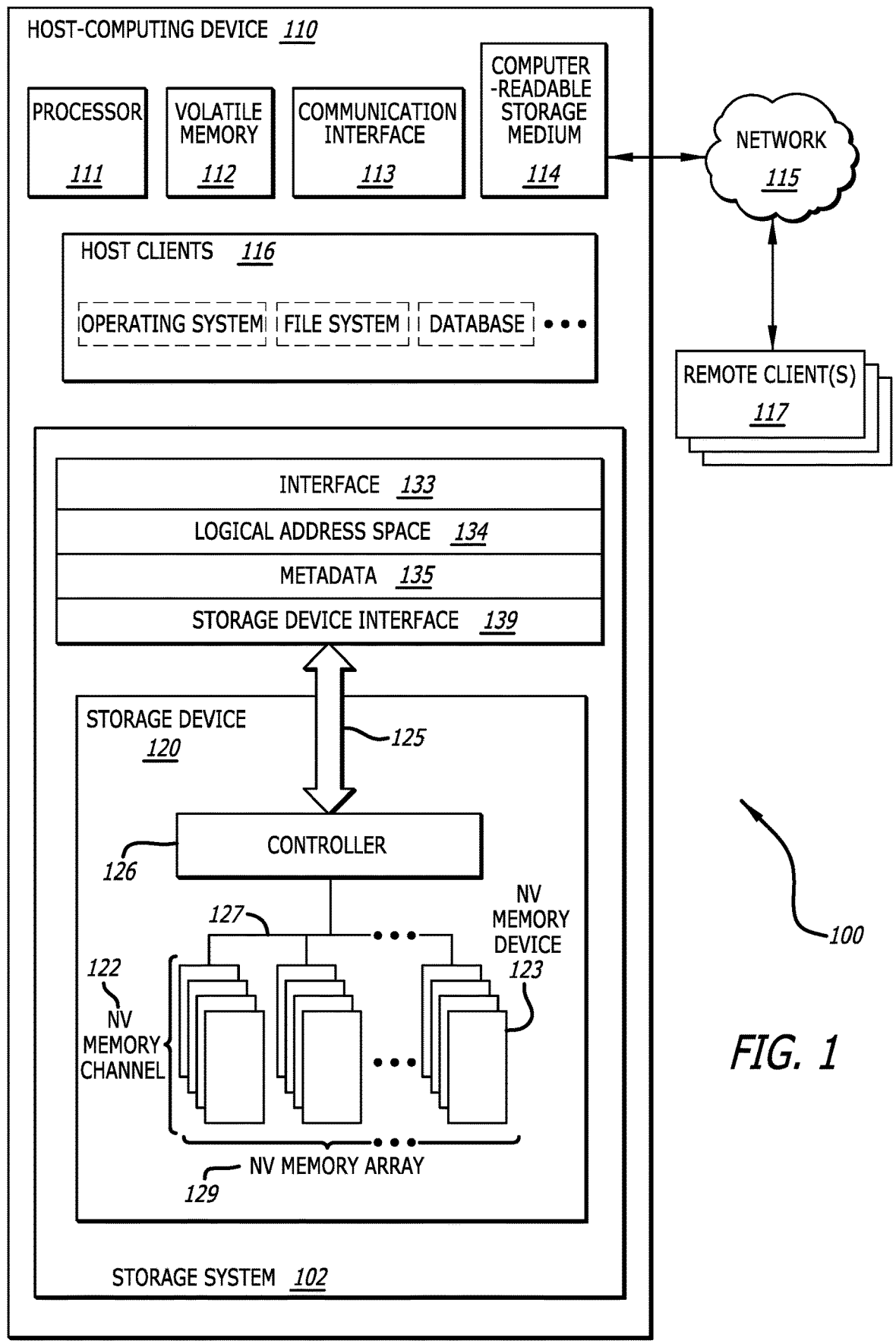
FIG. 1 is schematic block diagram of a host-computing device with a storage device suitable for enhanced stripe erase abort detections in accordance with an embodiment of the disclosure.

Corresponding reference characters indicate corresponding components throughout the several figures of the drawings. Elements in the several figures are illustrated for simplicity and clarity and have not necessarily been drawn to scale. For example, the dimensions of some of the elements in the figures might be emphasized relative to other elements for facilitating understanding of the various presently disclosed embodiments. In addition, common, but well-understood, elements that are useful or necessary in a commercially feasible embodiment are often not depicted in order to facilitate a less obstructed view of these various embodiments of the present disclosure.

DETAILED DESCRIPTION

In response to the problems described above, devices and methods are discussed herein that utilize an enhance erase abort detection process to properly evaluate the status of stripe-erase memory arrays after an aborted erase process. In many embodiments, processing a memory array after an ungraceful shutdown that aborted an erasure process includes going block by block to see where the erase abort occurred. In traditional erase abort detection methods, only the first and last word line within the block under inspection was analyzed. However, depending on the arrangement of the word lines within the memory block, these methods can lead to incorrect determinations, which may negatively affect the storage device.

For example, a memory block may be comprised of a plurality of page which themselves comprise a series of word lines. Often, the word lines may be ascribed a numerical demarcation wherein the first word line in the block is numbered 0, which the last word line within the block may also be an even number. In these embodiments, if the ungraceful shutdown occurred between the first and second steps of the stripe-erase process, the block may be determined to be erased, when nearly half of the word lines within the block were not fully erased. This results in a misdetection which can to the storage device failing to provide erase bake data retention prevention methods or may lead to overprogramming/overwriting of the memory devices, which can shorten the useful lifespan of the storage device over time.

Thus, various processes described herein include analyzing the status of both even and odd word lines within a block for determining the full status during an aborted erase operation. In this way, blocks that were interrupted between the first and second step of the stripe-erase process can be analyzed fully such that misdetections can be avoided. Because of this enhanced erase abort detection process, the lifespan of the storage devices utilizing stripe-erase operations can be maintained despite any configuration of word lines within memory blocks.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "function," "module," "apparatus," or "system." Furthermore, aspects of the present disclosure may take the form of a computer program product embodied in one or more non-transitory computer-readable storage media storing computer-readable and/or executable program code. Many of the functional units described in this specification have been labeled as functions, in order to emphasize their implementation independence more particularly. For example, a function may be implemented as a hardware circuit comprising custom VLSI circuits or gate arrays, off-the-shelf semiconductors such as logic chips, transistors, or other discrete components. A function may also be implemented in programmable hardware devices such as via field programmable gate arrays, programmable array logic, programmable logic devices, or the like.

Functions may also be implemented at least partially in software for execution by various types of processors. An identified function of executable code may, for instance, comprise one or more physical or logical blocks of computer instructions that may, for instance, be organized as an object, procedure, or function. Nevertheless, the executables of an identified function need not be physically located together but may comprise disparate instructions stored in different locations which, when joined logically together, comprise the function and achieve the stated purpose for the function.

Indeed, a function of executable code may include a single instruction, or many instructions, and may even be distributed over several different code segments, among different programs, across several storage devices, or the like. Where a function or portions of a function are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object-oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the functions and/or modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to", unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Further, as used herein, reference to reading, writing, storing, buffering, and/or transferring data can include the entirety of the data, a portion of the data, a set of the data, and/or a subset of the data. Likewise, reference to reading, writing, storing, buffering, and/or transferring non-host data can include the entirety of the non-host data, a portion of the non-host data, a set of the non-host data, and/or a subset of the non-host data.

Lastly, the terms "or" and "and/or" as used herein are to be interpreted as inclusive or meaning any one or any combination. Therefore, "A, B or C" or "A, B and/or C" mean "any of the following: A; B; C; A and B; A and C; B and C; A, B and C." An exception to this definition will occur only when a combination of elements, functions, steps, or acts are in some way inherently mutually exclusive.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

Referring to FIG. 1, a schematic block diagram of a host-computing device 110 with a storage system 102 suitable for enhanced stripe erase abort detections in accordance with an embodiment of the disclosure is shown. The control block management system 100 comprises one or more storage devices 120 of a storage system 102 within a host-computing device 110 in communication via a controller 126. The host-computing device 110 may include a processor 111, volatile memory 112, and a communication interface 113. The processor 111 may include one or more central processing units, one or more general-purpose processors, one or more application-specific processors, one or more virtual processors (e.g., the host-computing device 110 may be a virtual machine operating within a host), one or more processor cores, or the like. The communication interface 113 may include one or more network interfaces configured to communicatively couple the host-computing device 110 and/or controller 126 of the storage device 120 to a communication network such as an Internet Protocol (IP) network, a Storage Area Network (SAN), wireless network, wired network, or the like.

The storage device 120, in various embodiments, may be disposed in one or more different locations relative to the host-computing device 110. In one embodiment, the storage device 120 comprises one or more non-volatile memory devices 123, such as semiconductor chips or packages or other integrated circuit devices disposed on one or more printed circuit boards, storage housings, and/or other mechanical and/or electrical support structures. For example, the storage device 120 may comprise one or more direct inline memory module (DIMM) cards, one or more expansion cards and/or daughter cards, a solid-state-drive (SSD) or other hard drive device, and/or may have another memory and/or storage form factor. The storage device 120 may be integrated with and/or mounted on a motherboard of the host-computing device 110, installed in a port and/or slot of the host-computing device 110, installed on a different host-computing device 110 and/or a dedicated storage appliance on the network 115, in communication with the host-computing device 110 over an external bus (e.g., an external hard drive), or the like.

The storage device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the storage device 120 may be disposed on a peripheral bus of the host-computing device 110, such as a peripheral component interconnect express (PCI Express or PCIe) bus such, as but not limited to a NVM Express (NVMe) interface, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the storage device 120 may be disposed on a communication network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The host-computing device 110 may further comprise computer-readable storage medium 114. The computer-readable storage medium 114 may comprise executable instructions configured to cause the host-computing device 110 (e.g., processor 111) to perform steps of one or more of the methods disclosed herein. Additionally, or in the alternative, the buffering component 150 may be embodied as one or more computer-readable instructions stored on the computer-readable storage medium 114.

A device driver and/or the controller 126, in certain embodiments, may present a logical address space 134 to the host clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the storage device 120 may maintain metadata 135, such as a logical to physical address mapping structure, to map logical addresses of the logical address space 134 to media storage locations on the storage device(s) 120. A device driver may be configured to provide storage services to one or more host clients 116. The host clients 116 may include local clients operating on the host-computing device 110 and/or remote clients 117 accessible via the network 115 and/or communication interface 113. The host clients 116 may include, but are not limited to: operating systems, file systems, database applications, server applications, kernel-level processes, user-level processes, applications, and the like.

In many embodiments, the host-computing device 110 can include a plurality of virtual machines which may be instantiated or otherwise created based on user-request. As will be understood by those skilled in the art, a host-computing device 110 may create a plurality of virtual machines configured as virtual hosts which is limited only on the available computing resources and/or demand. A hypervisor can be available to create, run, and otherwise manage the plurality of virtual machines. Each virtual machine may include a plurality of virtual host clients similar to host clients 116 that may utilize the storage system 102 to store and access data.

The device driver may be further communicatively coupled to one or more storage systems 102 which may include different types and configurations of storage devices 120 including, but not limited to: solid-state storage devices, semiconductor storage devices, SAN storage resources, or the like. The one or more storage devices 120 may comprise one or more respective controllers 126 and non-volatile memory channels 122. The device driver may provide access to the one or more storage devices 120 via any compatible protocols or interface 133 such as, but not limited to, SATA and PCIe. The metadata 135 may be used to manage and/or track data operations performed through the protocols or interfaces 133. The logical address space 134 may comprise a plurality of logical addresses, each corresponding to respective media locations of the one or more storage devices 120. The device driver may maintain metadata 135 comprising any-to-any mappings between logical addresses and media locations.

A device driver may further comprise and/or be in communication with a storage device interface 139 configured to transfer data, commands, and/or queries to the one or more storage devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The storage device interface 139 may communicate with the one or more storage devices 120 using input-output control (IO-CTL) command(s), IO-CTL command extension(s), remote direct memory access, or the like.

The communication interface 113 may comprise one or more network interfaces configured to communicatively couple the host-computing device 110 and/or the controller 126 to a network 115 and/or to one or more remote clients 117 (which can act as another host). The controller 126 is part of and/or in communication with one or more storage devices 120. Although FIG. 1 depicts a single storage device 120, the disclosure is not limited in this regard and could be adapted to incorporate any number of storage devices 120.

The storage device 120 may comprise one or more non-volatile memory devices 123 of non-volatile memory channels 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more non-volatile memory devices 123 of the non-volatile memory channels 122, in certain embodiments, comprise storage class memory (SCM) (e.g., write in place memory, or the like).

While the non-volatile memory channels 122 is referred to herein as "memory media," in various embodiments, the non-volatile memory channels 122 may more generally comprise one or more non-volatile recording media capable of recording data, which may be referred to as a non-volatile memory medium, a non-volatile memory device, or the like. Further, the storage device 120, in various embodiments, may comprise a non-volatile recording device, a non-volatile memory array 129, a plurality of interconnected storage devices in an array, or the like.

The non-volatile memory channels 122 may comprise one or more non-volatile memory devices 123, which may include, but are not limited to: chips, packages, planes, die, or the like. A controller 126 may be configured to manage data operations on the non-volatile memory channels 122, and may comprise one or more processors, programmable processors (e.g., FPGAs), ASICs, micro-controllers, or the like. In some embodiments, the controller 126 is configured to store data on and/or read data from the non-volatile memory channels 122, to transfer data to/from the storage device 120, and so on.

The controller 126 may be communicatively coupled to the non-volatile memory channels 122 by way of a bus 127. The bus 127 may comprise an I/O bus for communicating data to/from the non-volatile memory devices 123. The bus 127 may further comprise a control bus for communicating addressing and other command and control information to the non-volatile memory devices 123. In some embodiments, the bus 127 may communicatively couple the non-volatile memory devices 123 to the controller 126 in parallel. This parallel access may allow the non-volatile memory devices 123 to be managed as a group, forming a non-volatile memory array 129. The non-volatile memory devices 123 may be partitioned into respective logical memory units (e.g., logical pages) and/or logical memory divisions (e.g., logical blocks). The logical memory units may be formed by logically combining physical memory units of each of the non-volatile memory devices 123.

The controller 126 may organize a block of word lines within a non-volatile memory device 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory device 123 may be physically arranged in a monotonically increasing sequence of word line addresses, with consecutively addressed word lines also being physically adjacent (e.g., WL0, WL1, WL2, . . . WLN).

The controller 126 may comprise and/or be in communication with a device driver executing on the host-computing device 110. A device driver may provide storage services to the host clients 116 via one or more interfaces 133. A device driver may further comprise a storage device interface 139 that is configured to transfer data, commands, and/or queries to the controller 126 over a bus 125, as described above.

Figure 2:
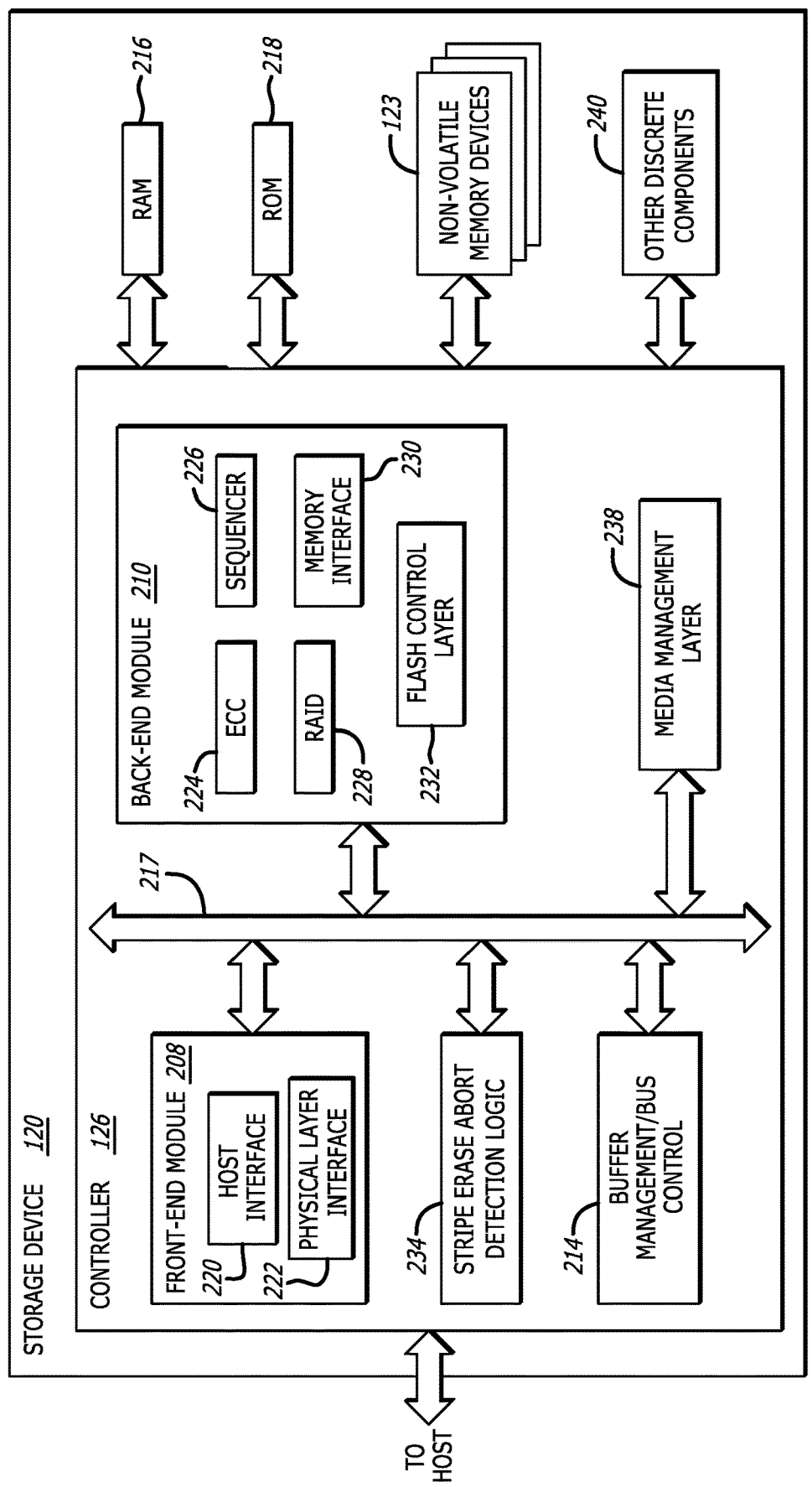
FIG. 2 is a schematic block diagram of a storage device suitable for enhanced stripe erase abort detections in accordance with an embodiment of the disclosure.

Referring to FIG. 2, a schematic block diagram of a storage device 120 suitable for enhanced stripe erase abort detections in accordance with an embodiment of the disclosure. The controller 126 may include a front-end module 208 that interfaces with a host via a plurality of high priority and low priority communication channels, a back-end module 210 that interfaces with the non-volatile memory devices 123, and various other modules that perform various functions of the storage device 120. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 126 may include a buffer management/bus control module 214 that manages buffers in random access memory (RAM) 216 and controls the internal bus arbitration for communication on an internal communications bus 217 of the controller 126. A read only memory (ROM) 218 may store and/or access system boot code. Although illustrated in FIG. 2 as located separately from the controller 126, in other embodiments one or both of the RAM 216 and the ROM 218 may be located within the controller 126. In yet other embodiments, portions of RAM 216 and ROM 218 may be located both within the controller 126 and outside the controller 126. Further, in some implementations, the controller 126, the RAM 216, and the ROM 218 may be located on separate semiconductor dies. As discussed below, in one implementation, the submission queues and the completion queues may be stored in a controller memory buffer, which may be housed in RAM 216.

Additionally, the front-end module 208 may include a host interface 220 and a physical layer interface 222 that provides the electrical interface with the host or next level storage controller. The choice of the type of the host interface 220 can depend on the type of memory being used. Examples types of the host interfaces 220 may include, but are not limited to, SATA, SATA Express, SAS, Fibre Channel, USB, PCIe, and NVMe. The host interface 220 may typically facilitate transfer for data, control signals, and timing signals.

The back-end module 210 may include an error correction controller (ECC) engine 224 that encodes the data bytes received from the host and decodes and error corrects the data bytes read from the non-volatile memory devices 123. The back-end module 210 may also include a command sequencer 226 that generates command sequences, such as program, read, and erase command sequences, to be transmitted to the non-volatile memory devices 123. Additionally, the back-end module 210 may include a RAID (Redundant Array of Independent Drives) module 228 that manages generation of RAID parity and recovery of failed data. The RAID parity may be used as an additional level of integrity protection for the data being written into the storage device 120. In some cases, the RAID module 228 may be a part of the ECC engine 224. A memory interface 230 provides the command sequences to the non-volatile memory devices 123 and receives status information from the non-volatile memory devices 123. Along with the command sequences and status information, data to be programmed into and read from the non-volatile memory devices 123 may be communicated through the memory interface 230. A flash control layer 232 may control the overall operation of back-end module 210.

Additional modules of the storage device 120 illustrated in FIG. 2 may include a media management layer 238, which performs wear leveling of memory cells of the non-volatile memory devices 123. The storage device 120 may also include other discrete components 240, such as external electrical interfaces, external RAM, resistors, capacitors, or other components that may interface with controller 126. In alternative embodiments, one or more of the RAID modules 228, media management layer 238 and buffer management/bus control module 214 are optional components that may not be necessary in the controller 126.

In certain embodiments, the stripe-erase abort detection logic 234 may facilitate the process of evaluating each block associated with an aborted erase command. In certain embodiments, upon restoration of operations after an ungraceful shutdown, the stripe-erase abort detection logic 234 may be provided with an aborted erase command which was affected. The aborted erase command can comprise a plurality of memory blocks which may have been affected. In many embodiments, the stripe-erase abort detection logic 234 can cycle through each of the blocks associated with the aborted erase command and scan one or more word lines within those blocks to determine the status of the block.

As described below, various word lines with a selected block can be scanned for readability or to determine if the word line is erased. The stripe-erase abort detection logic 234 can analyze both even and odd word lines within a block to determine the state of erasure during a stripe-erase process. Upon determination of status for the block, the stripe-erase abort detection logic 234 can evaluate another block within the plurality of blocks associated with the aborted erase command until all blocks have been evaluated. Depending on the configuration of the memory array within the storage device, the stripe-erase abort detection logic 234 can analyze word lines in a certain order and by performing either a read operation or an erasure detection operation. Either process can be done on an entire page of word lines or on single word lines as needed. For example, in some embodiments, the entire first page may be read to determine if the erasure process was started on the accompanying block. In some other embodiments, only the first word line of the first logical block is scanned for readable data. In yet further embodiments, an erasure state may be determined. The exact operation can often depend on the particular configuration of the memory array within the storage device and/or the particular type of stripe-erase process used. An example stripe-erase process is described below in FIG. 4.

Figure 3:
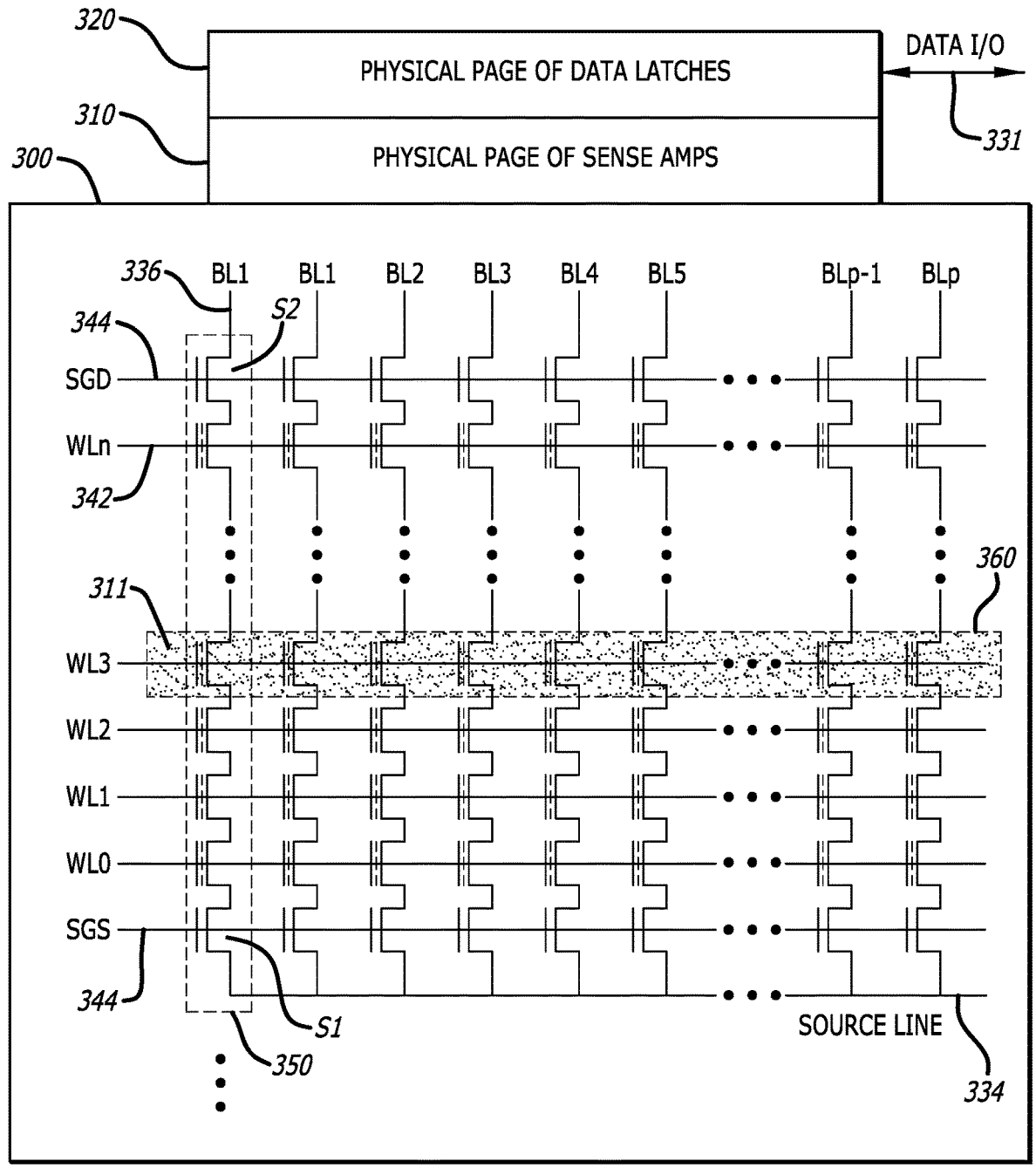
FIG. 3 is a conceptual illustration of a page of memory cells, organized for example in the NAND configuration, suitable for enhanced stripe erase abort detections in accordance with an embodiment of the disclosure.

Referring to FIG. 3, a conceptual illustration of a page of memory cells, organized for example in the NAND configuration 300, being sensed or programmed in parallel in accordance with an embodiment of the invention is shown. FIG. 3 conceptually shows a bank of NAND strings 350 within a non-volatile memory device 123 of FIG. 1. A 'page' such as the page 360, is a group of memory cells enabled to be sensed or programmed in parallel. This is accomplished in the peripheral circuits by a corresponding page of sense amplifiers 310. The sensed results are utilized in latches within a corresponding set of data latches 320. Each sense amplifier can be coupled to a NAND string, such as NAND string 350 via a bit line 336. For example, the page 360 is along a row and is sensed by a sensing voltage applied to the control gates of the cells of the page connected in common to the word line WL3. Along each column, each memory cell such as memory cell 311 is accessible by a sense amplifier via a bit line 336. Data in the data latches 320 are toggled in from or out to the memory controller 126 via a data I/O bus 331.

The NAND string 350 can be a series of memory cells, such as memory cell 311, daisy-chained by their sources and drains to form a source terminal and a drain terminal respective at its two ends. A pair of select transistors S1, S2 can control the memory cell chain's connection to the external source via the NAND string's source terminal and drain terminal, respectively. In a memory array, when the source select transistor S1 is turned on, the source terminal is coupled to a source line 334. Similarly, when the drain select transistor S2 is turned on, the drain terminal of the NAND string is coupled to a bit line 336 of the memory array. Each memory cell 311 in the chain acts to store a charge. It has a charge storage element to store a given amount of charge so as to represent an intended memory state. In many embodiments, a control gate within each memory cell can allow for control over read and write operations. Often, the control gates of corresponding memory cells of each row within a plurality of NAND strings are all connected to the same word line (such as WL0. WL1 . . . WLn 342). Similarly, a control gate of each of the select transistors S1, S2 (accessed via select lines 344 SGS and SGD respectively) provides control access to the NAND string via its source terminal and drain terminal respectively.

While the example memory device referred to above comprises physical page memory cells that store single bits of data, in most embodiments each cell is storing multi-bit data, and each physical page can have multiple data pages. Additionally, in further embodiments, physical pages may store one or more logical sectors of data. Typically, the host-computing device 110 (see FIG. 1) operating with a disk operating system manages the storage of a file by organizing the content of the file in units of logical sectors, which is typically in one or more units of 512 bytes. In some embodiments, a physical page may have 16 kB of memory cells being sensed in parallel by corresponding 16 kB of sense amplifiers via 16 kB of bit lines. An example logical sector assigned by the host has a size of 2 kB of data. Thus, a physical page can store 8 sectors if the cells are each configured to store 1 bit of data (SLC). For MLC, TLC, and QLC and other increased density structures, each cell can store 2, 3, 4 or more bits of data, and each physical page can store 16, 32, 64 or more logical sectors depending on the structure utilized.

One unique difference between flash memory and other types of memory is that a memory cell must be programmed from an erased state which is associated with no charge within the memory cell. This requires that the floating gate must first be emptied of charge prior to programming. Programming adds a desired amount of charge back to the floating gate. It does not support removing a portion of the charge from the floating to go from a more programmed state to a lesser one. Thus, new data cannot overwrite existing data and must be written to a previously unwritten or erased location. Furthermore, erasing all the charges from a floating gate can often take an appreciable amount of time. For that reason, it will be cumbersome and inefficient to erase cell by cell or even page by page. Therefore, in most embodiments, the array of memory cells is often divided into a large number of blocks. As is common in many flash-based memory systems, the block is often the unit of erase. That is, each block can contain the minimum number of memory cells that are erased in one action. This combined with the limited lifespans of memory cells within the flash memory increases the desire to limit the amount of erasing and programming occurring within the storage device.

Figure 4:
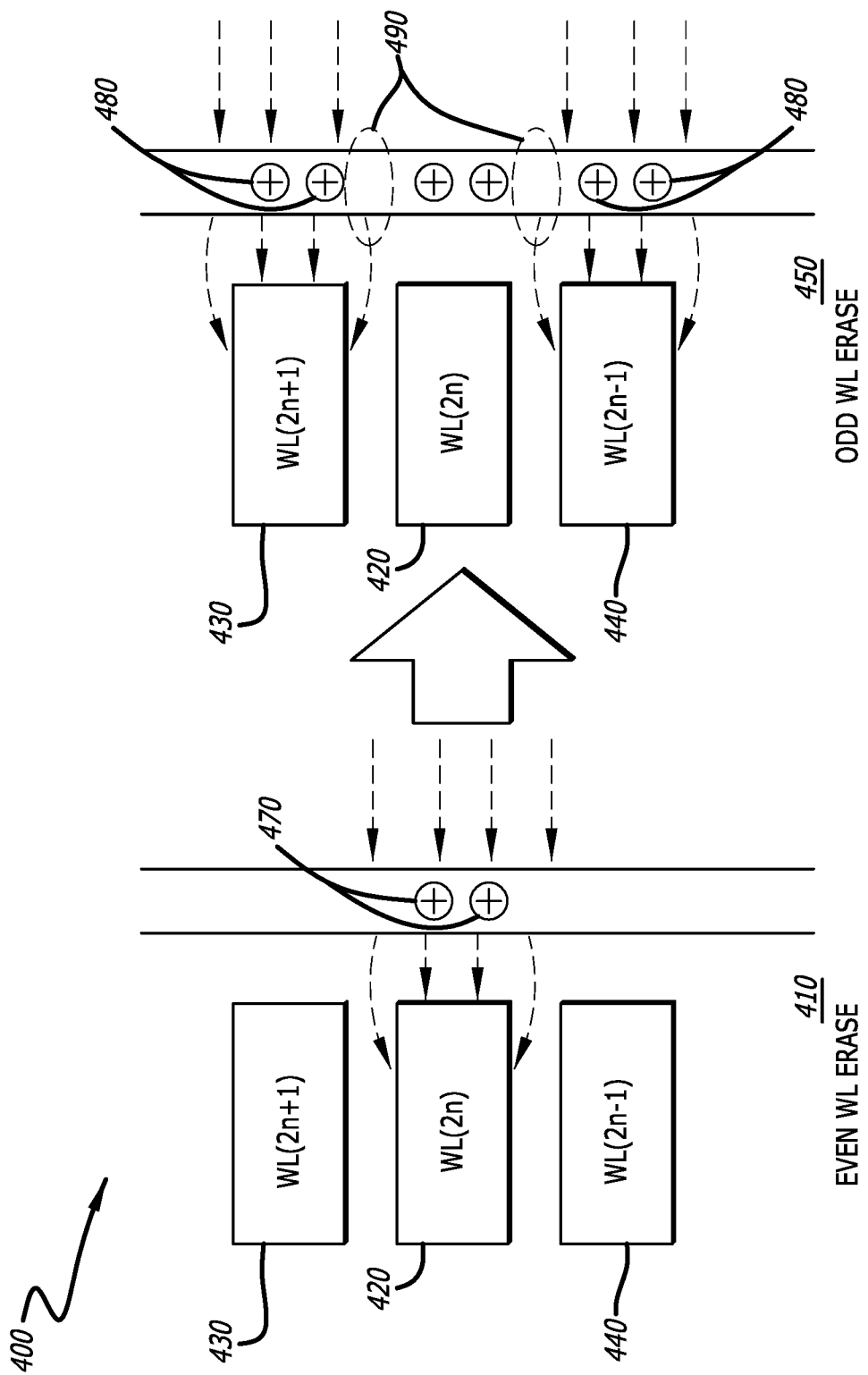
FIG. 4 is a conceptual illustration of a stripe erase process within neighboring word lines in accordance with embodiments of the disclosure.

Referring to FIG. 4, a conceptual illustration of a stripe-erase process 400 within neighboring word lines in accordance with embodiments of the disclosure is shown. Word lines within a block can be erased in a two-step pattern. In many embodiments, the stripe-erase process 400 comprises a first step 410 of erasing the even word lines (shown as "even wl erase"), while the second step 450 comprises erasing the odd world lines (shown as "odd wl erase"). It is contemplated that this two-step process may be operated in reverse depending on the configuration of the memory array and/or the desired application.

The illustrated embodiment of FIG. 4 depicts an even word line 420 (2n) disposed physically adjacent to two odd word lines 430, 440 (2n+1) and (2n−1). It will be recognized by those skilled in the art that word lines being labelled as "even" and "odd" can be an arbitrary and/or subjective numerically ascribed demarcation. That is, there is often not any physical or material difference in word lines that are processed as "odd" or as "even" within a storage device. For example, word lines may be numbered by a manufacturer internally based upon their physical location within the block. Likewise, controllers within the storage device may operate on word lines as odd or even based on a designation within one group or another without respect to a numerical label. For many embodiments, the purpose of odd and even labelling can be understood as a means of noting that the stripe erase process operates on a first set of word lines and then a second set of word lines, wherein each of the first set of word lines are physically disposed between word lines of the second set and vice versa. Labels may not even be numerical in nature and can instead be alphabetical or some other linear demarcation system.

The stripe-erase process 400 during a first step 410 injects holes 470 to the even word lines 420 instead of all word lines such as in traditional word line erase procedures. Those skilled in the art will recognize that injecting holes can be directed to a particular portion of the block such that only the even word lines 420 will be erased while the odd word lines 430, 440 will still contain a charge associated with stored data. In various embodiments, upon erasure of the even word lines 420, the stripe-erase process 400 can begin the second step 450 and inject additional holes 480 to the odd word lines 430, 440. The gaps 490 between the subsequent holes 480 can allow for the direction of the erasing process to the odd word lines 430, 440 only. At the end of the second step 450, the entire block can be at an erased state. By erasing the word lines 420-440 in "even" and "odd" groupings (i.e., in alternating groups) the erase occurs in a "stripe" fashion, hence the strip-erase name.

As those skilled in the art will recognize, the operations of a storage device can be interrupted at any moment. For example, a power loss may immediately shut down operations within the device. This is often referred to as an ungraceful shutdown. When the ungraceful shutdown occurs during an erasure process, an erase abort can occur. For stripe-erase storage devices, there is chance that the ungraceful shutdown occurs between the first step 410 and second step 450 of the stripe-erase process 400. This can create a situation wherein the even word lines are erased but the odd word lines are not.

Traditional methods of detecting erase aborts within blocks simply scan the first and last word line of the block and determine if there is a mismatch within their states. (Both word lines being erase indicates a block that was fully erased while both word lines not erased indicates that an erasure process didn't begin on that block.) However, certain configurations of memory arrays may include blocks that are configured such that the first and last word lines are both considered even. Thus, traditional erase abort detection methods will only determine that both word lines are erased and thus the entire block is erased when that is not the case. This can lead to potential issues such as overprogramming, etc. By utilizing erase abort detection methods described below in FIGS. 5 and 6, stripe-erase storage devices can be correctly labelled and processed, avoiding these potential issues.

Figure 5:
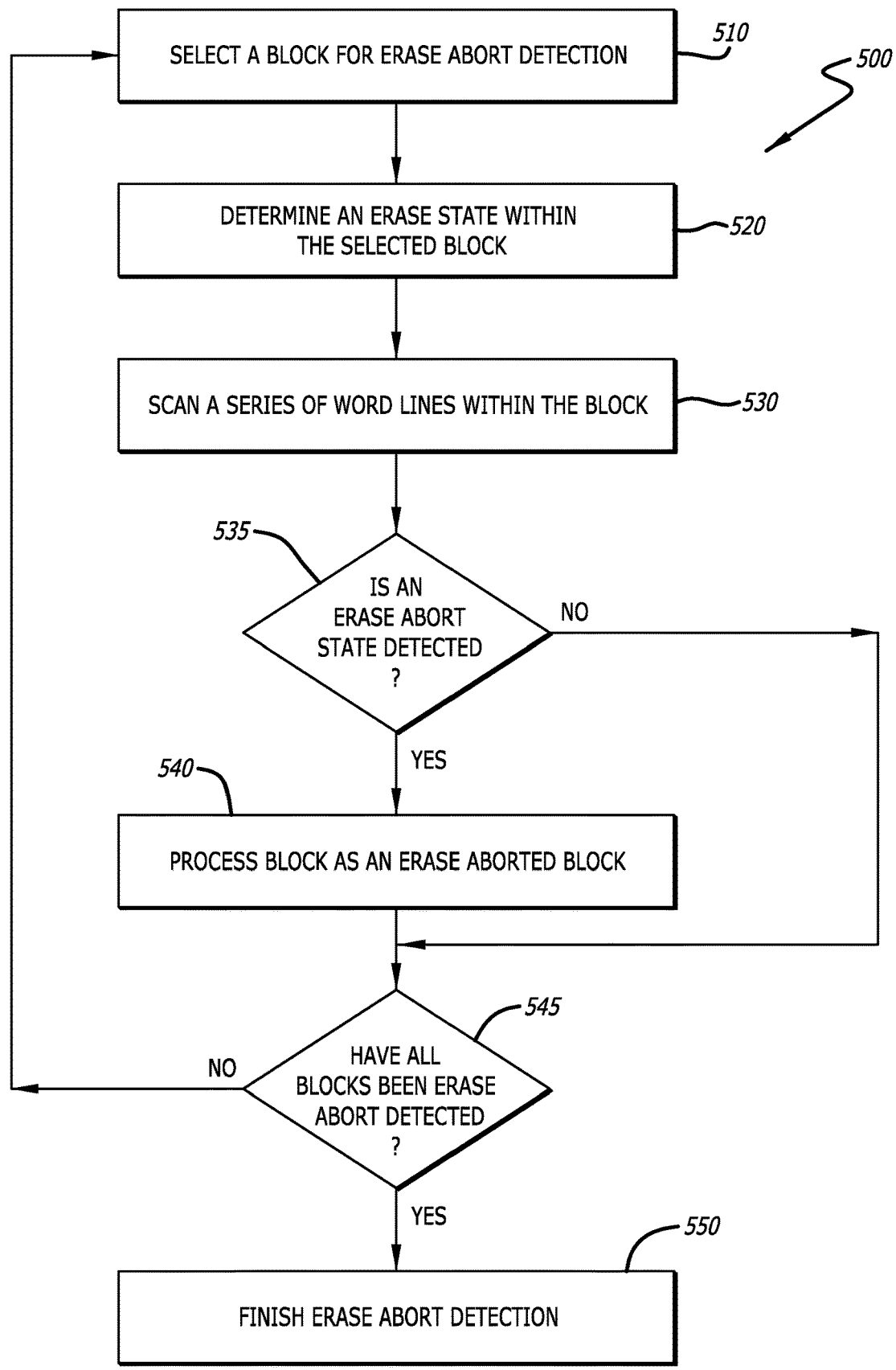
FIG. 5 is a flowchart depicting a process for erase abort detection in accordance with an embodiment of the disclosure.

Referring to FIG. 5, a flowchart depicting a process 500 for erase abort detection in accordance with an embodiment of the disclosure is shown. In many embodiments, the erase abort detection process 500 can being by selecting a block for processing (block 510). A plurality of blocks can be selected for erase abort detection. As described above, an ungraceful shutdown can create a questionable state on blocks that may have been in the middle of an erase process. The erase abort detection process 500 can cycle through each block within the plurality of selected blocks and evaluate if an erase process was aborted on that particular block.

In a number of embodiments, the process 500 can first evaluate an overall erase state for the block (block 520). In certain embodiments, this may include determining if the selected block was marked as erased by the controller or in some other location configured to log erased blocks. Often, an erase process will not mark a block as fully erased in a log or other tracking logic until the entire erasing process is completed. Thus, various embodiments may skip evaluating blocks in the erase abort detection process 500 if they are marked as erased already. Instead, these embodiments, may focus on blocks that were part of the aborted erase process and analyze only blocks not marked as erased.

For many embodiments, the process 500 will then scan a series of word lines within the block (block 530). As discussed above, traditional methods of erase abort detection may simply scan the first and last word lines within a block to determine its state. In methods described in more detail below in the discussion of FIG. 6, additional even and odd word lines can be scanned to detect erase aborts within strip-erase blocks.

Upon completion of the word line scans, the process 500 can determine if an erase abort state was detected (block 535). Typically, this can occur when there is a mismatch in states between the various scanned word lines, indicating that the erase process was interrupted when processing that particular block. If an erase state is not detected, the process 500 can determine if any other blocks within the plurality of selected blocks associated with the aborted erase command need to be processed (block 545). If there are more blocks within the plurality of selected blocks associated with the aborted erase command, the process 500 can repeat on other blocks within the plurality by selecting a new block (block 510). Conversely, if no other blocks remain to be evaluated, the process 500 can finish (block 550).

In response to an erase abort being detected, the block can be processed as an erase aborted block (block 540). As discussed in more detail in FIG. 6, the block may be fully erased and added to a pre-erase list or be subjected to standard processing. Once the erase aborted block has been processed, the process 500 can determine if all blocks associated with the aborted erase command have been write abort detected (block 545). If further blocks need to be processed, a new block can be selected (block 510). If all blocks have been processed, then the erase abort detection process can finish (block 550).

Figure 6:
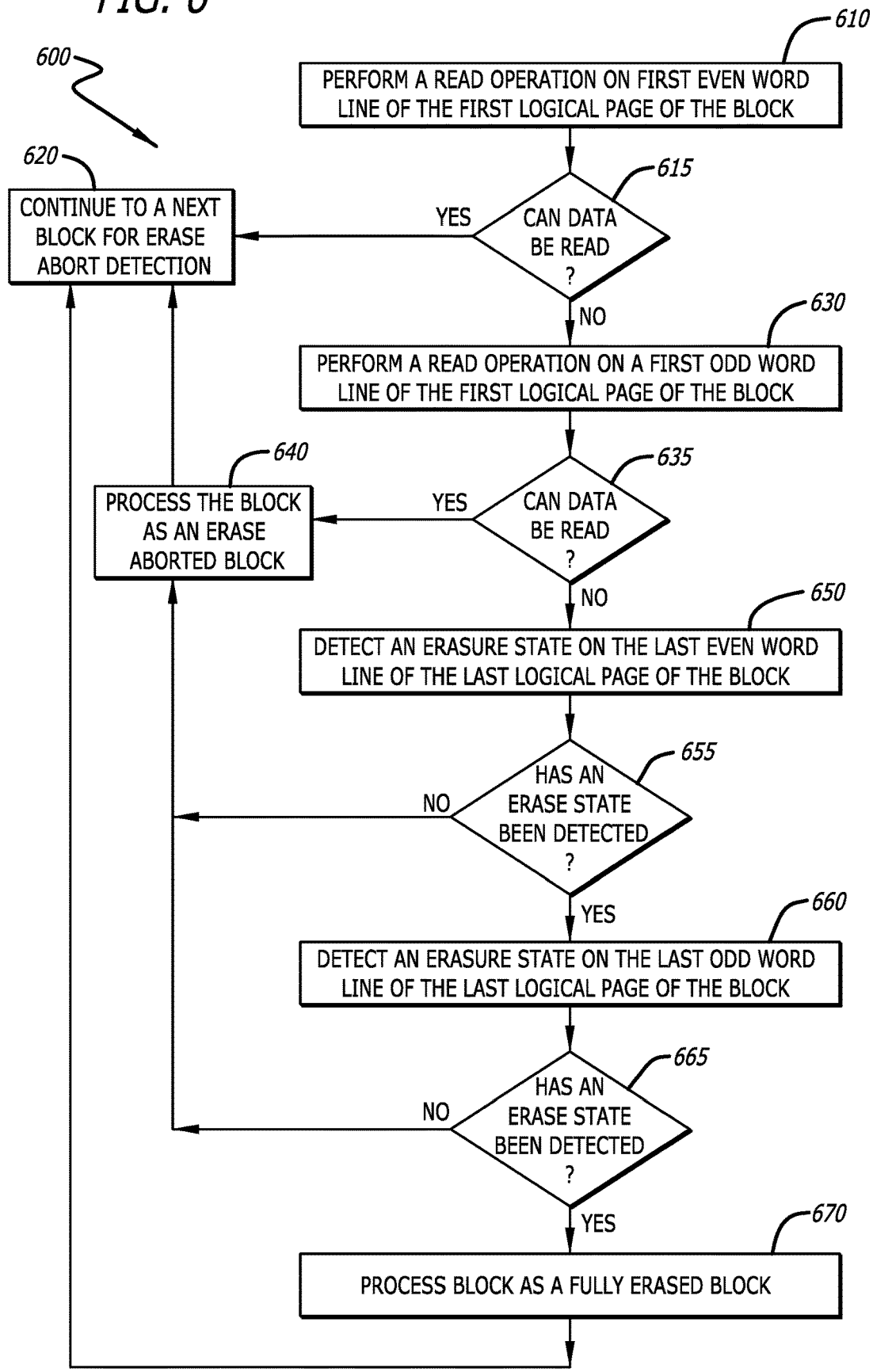
FIG. 6 is a flowchart depicting a process for detecting anf erase abort in stripe erase systems in accordance with an embodiment of the disclosure.

Referring to FIG. 6, a flowchart depicting a process for detecting an erase abort in stripe erase systems in accordance with an embodiment of the disclosure is shown. In many embodiments, the process 600 can begin by performing a read operation on the first even word line of the first logical page of the block (block 610). As discussed above, blocks are typically divided into a series of pages which themselves comprise a series of blocks. In a variety of embodiments, the first word line is often numerically demarcated as word line 0, which is considered an even word line. Thus, a number of embodiments begin the stripe-erase abort detection process by reading the first word line of the first page of the selected block. The result of this read operation can be utilized to determine if data can be read from the word line (block 615). In additional embodiments, the process 600 may attempt to read the entire page to determine if data is stored and readable within the page. In further embodiments, the process 600 may attempt to determine if an uncorrectable error correction code is associated with the word line.

If data can be read from the first even word line (or in some embodiments, the entire first page), then the process 600 can continue to a next block for erase abort detection (block 620). For example, if data can be read from the first page, this can indicate that an erase process was not started on the block and therefore does not suffer from an aborted process. If data cannot be read, the process 600 can next perform a read operation on a first odd word line of the first logical page of the block (block 630). The results of this read operation can be utilized to determine if data can be read from the odd word line(s) (block 635). In more embodiments, the process 600 may attempt to perform a read operation on many or all odd word lines of the first logical page of the block.

If data can be read on the odd word line, while not being readable on an even word line, this may indicate an erase abort on this block. As such, the process 600 can process the block as an erase aborted block (block 640). In a number of embodiments, processing an erase aborted block includes at least fully erasing the block. Upon erase abort processing, the process 600 can then continue to a next block associated with the aborted erase command for erase abort detection (block 620). If data cannot be read from the odd word line(s) of the first logical page, then a further erasure detection may be performed on the last even word line of the last logical page of the block (block 650).

As previously discussed, many versions of storage devices may utilize word line arrangements within blocks, such that the last demarcated word line is an even word line. In this way, the erasure detection may occur on the last word line of the last page of the selected block. The results of the erasure detection can be utilized to determine if an erase state has been detected (block 655). If it is determined that no erase state has been found on the last even word line of the last logical page of the selected block, while data was not found on the first odd word line of the first logical page of the selected block, then it can be determined that the selected block was erase aborted. Thus, the selected block can be processed as an erase aborted block (block 640). If an erase state was detected on the last even word line of the last logical page of the selected block, a further erasure detection on the last odd word line of the last logical page of the block can be performed (block 660).

As previously discussed, storage devices that utilize a stripe-erase process have the potential to be interrupted between the first and second stages of the word line erasure. For blocks that have an even word line as the last word line of the last logical page, traditional scanning of the last word line only may indicate erasure when only the first step of the stripe-erase process was completed, meaning that an erase aborted block may be mischaracterized as fully erased, causing various problems in further use. Thus, scanning the last even and odd word lines of the last logical page of the selected block can yield a more complete picture of the status of the block.

The results from performing an erasure detection of the last odd word line of the last logical page of the selected block may be utilized to determine if an erase state has been detected (block 665). Similarly to the previous determination discussed, if the last odd word line of the last logical page of the selected block does not indicate an erase state, while other word lines within the selected block do indicate an erase state, an aborted erase within the selected block can be inferred. Thus, the selected block can then be processed as an erase aborted block (block 620).

Conversely, if the last odd word line of the last logical page of the selected block indicates an erasure state similarly to the other analyzed word lines, then it may be determined that the selected block was fully erased. In these embodiments, the process 600 can process the selected block as a fully erased block (block 670). In certain embodiments, this processing can vary upon whether various features are enabled within the storage device. For example, in storage devices that utilize a pre-erase feature, the selected block can be put in a block erase list and utilized in a subsequent pre-erase process. In a variety of embodiments, the selected block may undergo a flash-write before release the block to a free block list. Upon completion of processing the fully erased block, the process 600 can then continue to a next block for erase abort detection (block 620). This process can repeat until all blocks associated with the aborted erase command have been processed.

Information as herein shown and described in detail is fully capable of attaining the above-described object of the present disclosure, the presently preferred embodiment of the present disclosure, and is, thus, representative of the subject matter that is broadly contemplated by the present disclosure. The scope of the present disclosure fully encompasses other embodiments that might become obvious to those skilled in the art, and is to be limited, accordingly, by nothing other than the appended claims. Any reference to an element being made in the singular is not intended to mean "one and only one" unless explicitly so stated, but rather "one or more." All structural and functional equivalents to the elements of the above-described preferred embodiment and additional embodiments as regarded by those of ordinary skill in the art are hereby expressly incorporated by reference and are intended to be encompassed by the present claims.

Moreover, no requirement exists for a system or method to address each and every problem sought to be resolved by the present disclosure, for solutions to such problems to be encompassed by the present claims. Furthermore, no element, component, or method step in the present disclosure is intended to be dedicated to the public regardless of whether the element, component, or method step is explicitly recited in the claims. Various changes and modifications in form, material, work-piece, and fabrication material detail can be made, without departing from the spirit and scope of the present disclosure, as set forth in the appended claims, as might be apparent to those of ordinary skill in the art, are also encompassed by the present disclosure.

What is claimed is:

1. A device comprising:
   a processor;
   a memory array comprising:
     a plurality of memory devices configured in a series of blocks; and
     wherein the blocks comprise a plurality of pages, and the plurality of pages further comprises a series of word lines; and
   a stripe-erase abort detection logic configured to:
     determine a plurality of blocks within the memory array associated with an aborted erase process;
     select one block within the plurality of blocks;
     select a first even word line of the selected block;
     perform a read operation to read the selected word line;
     select a first odd word line of the selected block;
     perform a read operation to read the selected word line;
     determine if either of the selected word lines has been erased; and
     erase the entire block if one selected word line was readable and the other selected word line is not readable.

2. The device of claim 1, wherein the stripe-erase abort detection logic is further configured to determine if an uncorrectable error correction code is associated with the selected word lines.

3. The device of claim 2, wherein erasing the entire block occurs upon either:
   a determination of one selected word line was readable and the other selected word line is not readable; or
   an uncorrectable error correction code associated with either of the selected word lines.

4. The device of claim 1, wherein the strip-erase abort detection logic is further configured to, upon determination of the first even and first odd selected word lines being erased:
   select a last even word line of the selected block;
   determine if the selected last even word line is erased;
   erase the entire block if the selected last even word line is determined to not be erased.

5. The device of claim 4, wherein the strip-erase abort detection logic is further configured to, upon determination of the first even, first odd, and last even selected word lines being erased:
   select a last even word line of the selected block;
   determine if the selected last even word line is erased;
   erase the entire block if the selected last even word line is determined to not be erased.

6. The device of claim 5, wherein the stripe-erase abort detection logic is further directed to, upon determining that all selected word lines are erased, determine if pre-erase functionality is supported within the device.

7. The device of claim 6, wherein the stripe-erase abort detection logic is further configured to, upon determining that pre-erase functionality is supported, assign the selected block to an erase list.

8. The device of claim 6, wherein the stripe-erase abort detection logic is further configured to, upon determining that pre-erase functionality is not supported,
   perform a flash write on the selected block; and
   release the selected block to a free block list.

9. The device of claim 1, wherein the stripe-erase abort detection logic is further configured to select another block within the plurality of blocks associated with the received erase command upon completion of the erasure of the entire block.

10. A method for detecting aborted erasures in memory blocks, comprising:
- determining an aborted erase command associated with a plurality of blocks within a memory array, wherein the memory array is comprised of a plurality of memory devices, the blocks comprise a plurality of pages, and the plurality of pages further comprises a series of word lines;
- selecting one block within the plurality of blocks;
- selecting a first even word line of the selected block;
- performing a read operation to read the selected word line;
- selecting a first odd word line of the selected block;
- performing a read operation to read the selected word line;
- determining if either of the selected word lines has been erased; and
- erasing the entire block if:
  - the first even word line was readable and the first odd word line is not readable; or
  - the first even word line was not readable and the first odd word line was readable.

11. The method of claim 10, wherein the determination is for determining if an uncorrectable error correction code has been associated with the first even or first odd word line.

12. The method of claim 11, wherein the erasing of the entire block occurs if an uncorrectable error correction code has been determined to be associated with either the first even or first odd word line.

13. The method of claim 10, wherein the method further comprises, upon determining that the first even and first odd selected word lines are erased:
- selecting a last even word line of the selected block;
- determining if the selected last even word line is erased;
- erasing the entire block if the selected last even word line is determined to not be erased.

14. The method of claim 13, wherein the method further comprises, upon determining the first even, first odd, and last even selected word lines are erased:
- selecting a last even word line of the selected block;
- determining if the selected last even word line is erased;
- erasing the entire block if the selected last even word line is determined to not be erased.

15. The method of claim 10, wherein the plurality of blocks are erased with a stripe-erase method.

16. The method of claim 15, wherein the stripe-erase method erases word lines corresponding to an even numerically ascribed demarcation prior to word lines corresponding to an odd numerically ascribed demarcation.

17. The method of claim 15, wherein the stripe-erase method erases word lines corresponding to an odd numerically ascribed demarcation prior to word lines corresponding to an even numerically ascribed demarcation.

18. The method of claim 10, wherein the method is performed following an ungraceful shutdown of a storage device.

19. The method of claim 10, wherein the method is performed as part of an initialization process during a power on cycle.

20. A device comprising:
- a processor;
- a memory array comprising:
  - a plurality of memory devices configured in a series of blocks; and
  - wherein the blocks comprise a plurality of pages, and the plurality of pages further comprises a series of word lines; and
- a stripe-erase abort detection logic configured to:
  - determine a plurality of blocks within the memory array associated with an aborted erase process;
  - select one block within the plurality of blocks;
  - select a first even word line of the selected block;
  - perform a read operation to read the selected word line;
  - select a first odd word line of the selected block;
  - perform a read operation to read the selected word line;
  - determine if either of the selected word lines has been erased or are associated with an uncorrectable error correction code; and
- erase the entire block if:
  - the first even word line was readable and the first odd word line is not readable;
  - the first even word line was not readable and the first odd word line was readable; or
  - either the first even word line or first odd word line are associated with an uncorrectable error correction code.

* * * * *